US008753788B1

(12) United States Patent
Yu et al.

(10) Patent No.: US 8,753,788 B1
(45) Date of Patent: Jun. 17, 2014

(54) APPARATUS OF REPAIRING A MASK AND A METHOD FOR THE SAME

(71) Applicant: Taiwan Semiconductor Manufacturing Company, Ltd., Hsin-Chu (TW)

(72) Inventors: Chia-Hao Yu, Hsinchu (TW); Yun-Yue Lin, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/733,005

(22) Filed: Jan. 2, 2013

(51) Int. Cl.
*G03F 1/72* (2012.01)
*G01N 21/00* (2006.01)

(52) U.S. Cl.
USPC ........... 430/5; 430/30; 356/237.4; 356/237.5; 382/144

(58) Field of Classification Search
USPC ............ 430/5, 30; 356/237.4, 237.5; 382/144
See application file for complete search history.

(56) References Cited

U.S. PATENT DOCUMENTS

| 6,821,682 | B1 | 11/2004 | Stearns et al. |
| 6,967,168 | B2 | 11/2005 | Stearns et al. |
| 7,230,695 | B2 | 6/2007 | Ikuta et al. |
| 2003/0006214 | A1 | 1/2003 | Stearns et al. |
| 2006/0007433 | A1 | 1/2006 | Ikuta et al. |
| 2006/0234135 | A1 | 10/2006 | Hau-Riege et al. |

OTHER PUBLICATIONS

Seung Yoon Lee et al., "Investigation of Multilayer Structural Changes in Phase and Amplitude-Defects Corrections Process," Journal of Vacuum Science and Technology B 23, Nov./Dec. 2005, pp. 2866-2869 (5 pages total).
Stefan P. Hau-Riege et al., "Repair of Phase Defects in Extreme-Ultraviolet Lithography Mask Blanks," Journal of Applied Physics, vol. 96, No. II, Dec. 1, 2004, pp. 6812-6821 (11 pages total).
P. B. Mirkarimi et al., "Method for Repairing Mo/Si Multilayer Thin Film Phase Defects in Reticles for Extreme Ultraviolet Lithography," Journal of Applied Physics, vol. 91, No. I, Jan. 1, 2002, pp. 818-819 (10 pages total).

*Primary Examiner* — Christopher Young
(74) *Attorney, Agent, or Firm* — Haynes and Boone, LLP

(57) ABSTRACT

An apparatus includes a probe tip configured to contact the mask, a cantilever configured to mount the probe tip wherein the cantilever includes a mirror, an optical unit having a light source projecting a light beam on the mirror and a light detector receiving a reflected light beam from the mirror, and an electrical power supply configured to connect the probe tip. The apparatus further includes a computer system configured to connect the optical unit, the electrical power supply, and the stage. The electrical power supply provides an electrical current to the probe tip and heats the probe tip to a predetermined temperature. The heated probe tip repairs a defect by smoothing and reducing a dimension of the defect, and inducing structural deformations of multilayer that cancel out the distortion (of multilayer) caused by buried defects using the heated probe tip as a thermal source canning the defect.

20 Claims, 5 Drawing Sheets

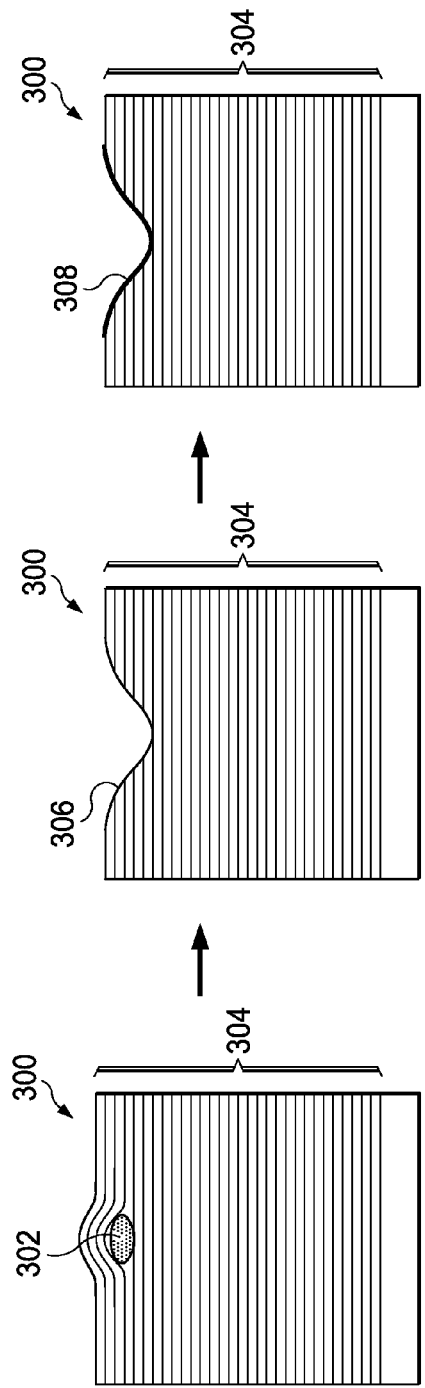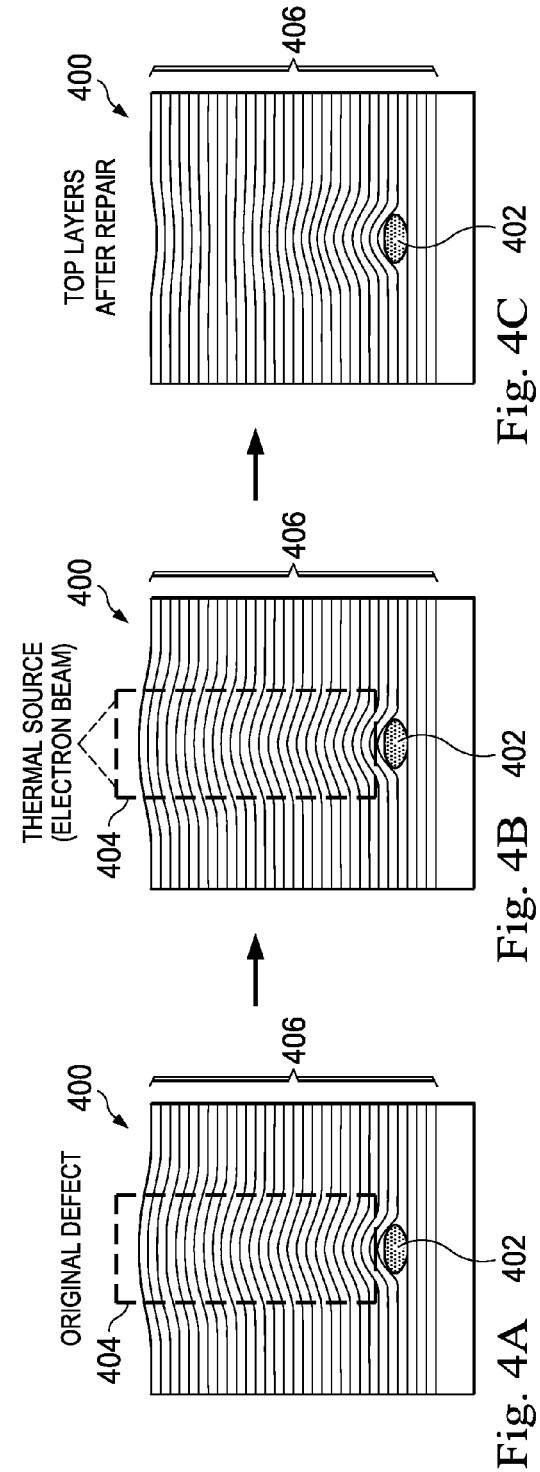

APPARATUS OF REPAIRING A MASK AND A METHOD FOR THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

Such scaling down has also increased the complexity of processing and manufacturing ICs and, for these advances to be realized, similar developments in IC processing and manufacturing are needed. For example, extreme ultraviolet lithography (EUVL) is implemented to meet a need of a higher resolution lithography process. EUVL typically uses a an extreme ultraviolet (EUV) mask, including a reflective multilayer (ML). Repairing a phase defect in the ML of an EUV mask raises challenges. Accordingly, what is needed is a device and method that addresses the above issues and continues to improve the semiconductor manufacture process in a wafer fab. Also what is need is an improved mask, such as can be used in EUVL.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

FIGS. 3A-C are examples of repairing an EUV mask using a first method.

FIGS. 4A-C are examples of repairing an EUV mask using a second method.

DETAILED DESCRIPTION

Figure 1:
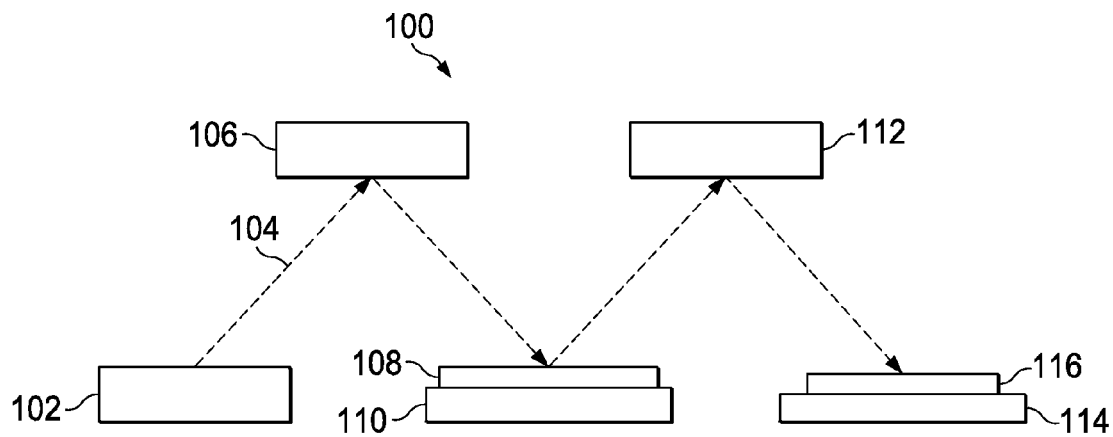
FIG. 1 is a diagram of an extreme ultraviolet (EUV) lithography exposing tool that can benefit from one or more embodiments of the present invention.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Referring now to FIG. 1, an extreme ultraviolet (EUV) lithography system 100 is an example of a system that can benefit for one or more embodiments of the present disclosure. The EUV lithography system 100 includes a radiation source 102, an illumination beam 104, condenser optics 106, a mask 108, a mask stage 110, projection optics 112, and a substrate stage 114. However, other configurations and inclusion or omission of the device may be possible. In the present disclosure, the system 100 is also referred as a stepper or a scanner; and the mask 108 is also referred to as a photomask, a photo mask, or a reticle. In the present embodiment, the radiation source 102 includes a laser providing the illumination beam 104 having a wavelength in an EUV range. For example, a high-power neodymium-doped yttrium aluminum garnet (Nd-YAG) laser beam focused on a xenon gas, liquid, or solid target produces 30 to 45 eV plasma that emits an EUV illumination beam having a wavelength of approximately 13.4 nm. The condenser optics 106 includes a multilayer coated collector and a plurality of grazing mirrors and is configured to collect and shape the illumination beam 104 and provide a slit of the illumination beam 104 to the mask 108 secured by the mask stage 110. The mask 108 provides an aerial image from the mask 108 to the illumination beam 104. The mask 108 includes a transmissive mask or a reflective mask. In the present embodiments, the mask 108 is the reflective mask. The mask 108 is positioned on the mask stage 110. The mask stage 110 includes a plurality of motors, roller guides, and tables; secures the mask 108 on the mask stage 110 by vacuum; and provides the accurate position and movement of the mask 108 in X, Y and Z directions during alignment, focus, leveling and exposure operation in the EUV lithography system 100. The projection optical 112 include a magnification lens and a plurality of mirrors, providing a reduction of the aerial image of the mask 108 to the resist film 118 deposited on the substrate 116 secured by the substrate stage 114. The substrate stage 114 includes motors, roller guides, and tables; secures the substrate 116 by vacuum; and provides the accurate position and movement of the substrate 116 in X, Y and Z directions during alignment, focus, leveling and exposing operation in the EUV lithography system 100 so that the image of the mask 108 is transferred onto the substrate in a repetitive fashion (though other lithography methods are possible). The system 100, or portions thereof, may include additional items, such as a vacuum system and/or a cooling system.

In the present embodiment, the mask 108 in the EUV lithograph system 100 shown in FIG. 1 includes a main pattern. The main pattern is formed in an absorption layer deposited on a reflective multilayer (ML). When an EUV illumination beam is projected on the mask 108, a portion of the EUV illumination beam projected on the patterned absorption layer is absorbed by the absorption layer and another portion of the EUV illumination beam projected on the reflective ML is reflected to a projection optics. Therefore, a patterned EUV illumination is generated by the mask 108, is reflected to the project optical 112 and then is projected to a resist film deposited on a wafer substrate secured by the stage 114 to expose the resist film. After developing the exposed resist film, a resist pattern is formed on the wafer substrate.

Figure 2:
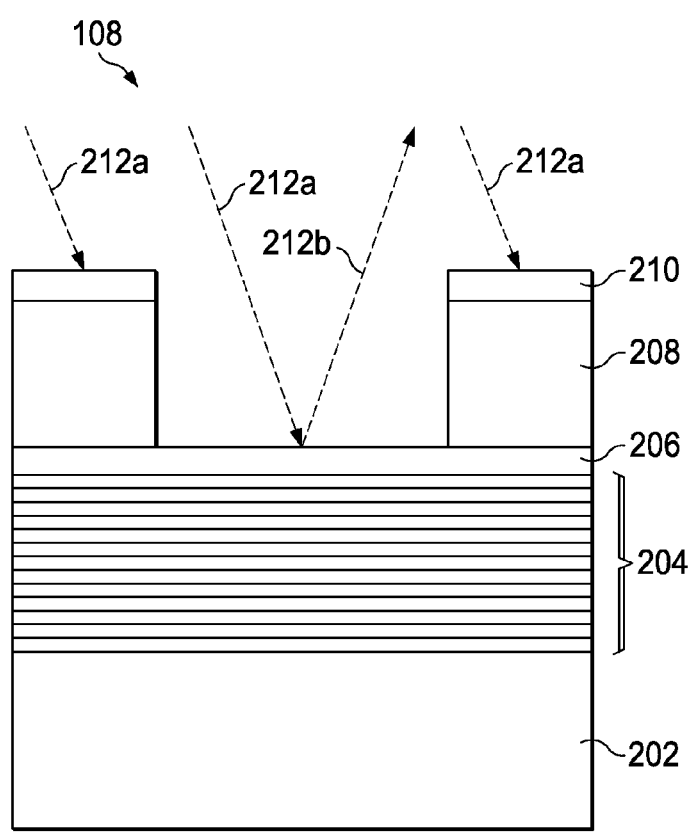
FIG. 2 is an example of an EUV mask for use in the system of FIG. 1.

Referring to FIG. 2, the example reflective EUV mask 108 used in FIG. 1 is illustrated in greater detail. In this example, a reflective ML 204 is deposited on a mask substrate 202, a capping layer 206 is deposited over the reflective ML 204, an absorption layer 208 is deposited on the capping layer 206, and a protection layer 210 is deposited on the absorption layer 208. As shown in FIG. 2, a portion of an illumination beam 212a projected on the absorption layer 208 is absorbed by the absorption layer 208 and another portion of the illumination beam 212a projected on the reflective ML 204 is reflected by the reflective ML 204. A patterned illumination bean 212b is thereby generated.

One of challenges using a reflective EUV lithography technique occurs when a defect appears in/on a reflective EUV mask. While a relatively small defect may be not significantly detrimental when using a transmissive mask, a similar defect may be significant when using a reflective EUV mask. For example, a defect in a reflective ML may change or distort a reflected illumination beam in direction, shape, or phase. Therefore, a quality or integrity of the corresponding exposed image is impacted by the defect located in the reflective ML of the reflective EUV mask. In the present embodiments, a defect in a reflective ML of a reflective EUV mask is also referred to as a phase defect.

Referring to the example of FIGS. 3A-C, a first method 300 for repairing a defect is illustrated. In the present embodiments, a defect could be a phase defect. The method 300 includes locating a phase defect 302 buried in a reflective ML 304 by a scanning technique shown in FIG. 3A, such as an atomic force microscope (AFM); removing the defect and related neighborhood area to form to be repaired area 306 by a removing technique, such as a focused ion beam (FIB) technique as shown in FIG. 3B; and depositing a capping layer 308 over the to be repaired area 306 as shown in FIG. 3C, such as by chemical vapor deposition (CVD), physical vapor deposition (PVD), or atomic level deposition (ALD). However, the method 300 may result in reflectivity degradation in the repaired area. The method 300 may further damage the repaired area by the defect repair process or a following cleaning process.

Referring to the example of FIGS. 4A-C, a second method 400 for repairing a phase defect is illustrated. The method 400 includes locating a defect area 404 caused by a phase defect 402 buried in a reflective ML 406 by a scanning technique shown in FIG. 4A, such as an AFM; applying a thermal source, such as a high energy electron beam, over the phase defect 402 as shown in FIG. 4B; and smoothing a local reflective ML in the defective area 404 overlying the phase defect 402 by the thermal source as shown in FIG. 4C. As shown in FIG. 4C, the defect area 404 is fixed by smoothing the impacted local ML by the phase defect 402. However, the method 400 may have reflectivity degradation issues by over-repairing caused by high the energy of the electron beam. The method 400 may cause by-product contamination, such as carbon contamination, induced by the electron beam. The method 400 may have a non-stable repairing accuracy issue caused by static charges of the electron beam. The method 400 may require a special designed tool to generate a high acceleration voltage and current. The method 400 also needs an extra tool, such as an AFM, to do defect qualification by collecting defect shape before and after defect repairing.

Figure 5A:
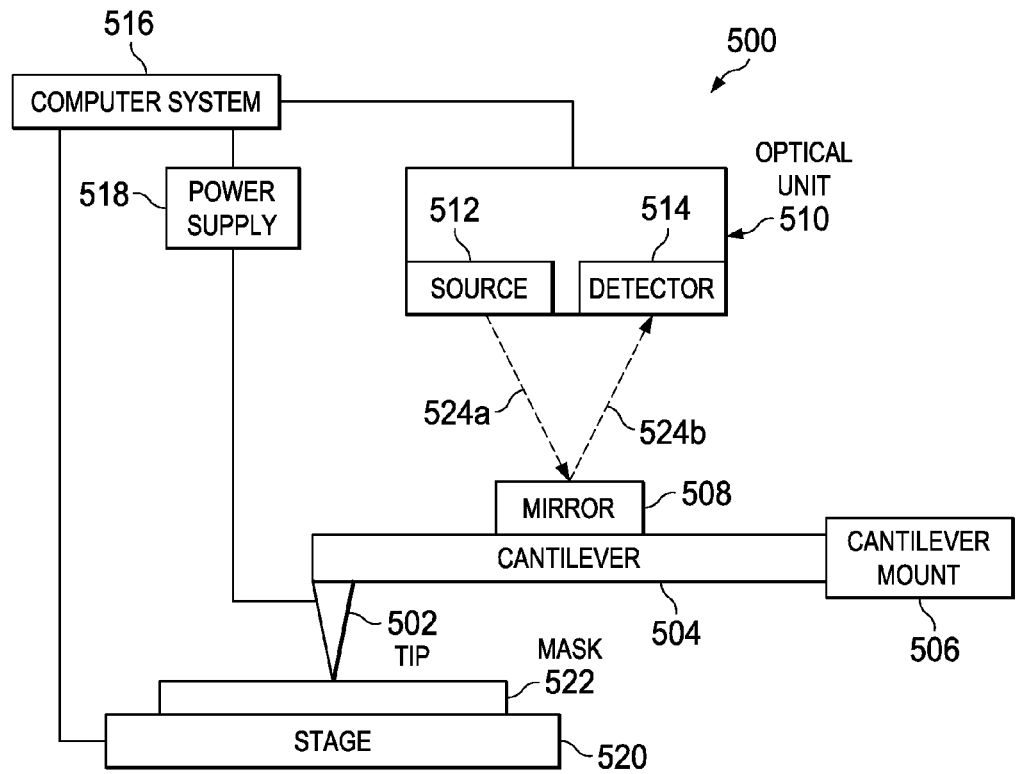
FIG. 5A is a diagram of an apparatus for repairing an EUV mask according to one or more embodiments of the present invention.

Referring to FIG. 5A, a diagram of an apparatus 500 for repairing a defect on a mask is illustrated for implementing one or more embodiments. The apparatus 500 includes a probe tip 502, a cantilever 504, a cantilever mount 506, a mirror 508, an optical unit 510 which includes a light source 512 and a light detector 514, a computer system 516, an electrical power supply 518, and a stage 520. It is understood that other configurations and inclusion or omission of various items in the apparatus 500 may be possible.

The probe tip 502 is configured to mount to a first end of the cantilever 504. The probe tip 502 is also configured to connect to the power supply 518. The probe tip 502 includes a metal, a metal alloy, a metal compound, or a diamond. Other alternative materials are possible. The probe tip 502 has electrical and thermal resistance properties such that the probe tip 502 can be heated to a predetermined temperature and can remain at the predetermined temperature when an electrical current is applied to the probe tip 502. The predetermined temperature may be a function of the electrical current (e.g., frequency, amplitude, or level) and the amount of time the current is applied to the probe tip 502.

In some embodiments, the probe tip 502 is designed to contact and scan the surface of the mask 522 secured on the stage 520, collect topography information of the surface of the mask 522, locate a position and dimension of a phase defect on the mask 522, and repair the phase defect by smoothing a related ML using the heated probe tip 502 as a thermal source over the phase defect. For example, the probe tip 502 can detect a phase defect with a local height difference larger than 3 nm on the surface of a reflective ML. In some embodiments, the probe tip 502 can be heated to a temperature ranging from about 200 to 1200° C., such that the heated probe tip 502 is considered a thermal source to repair a phase defect.

Figures 5B, 5C:
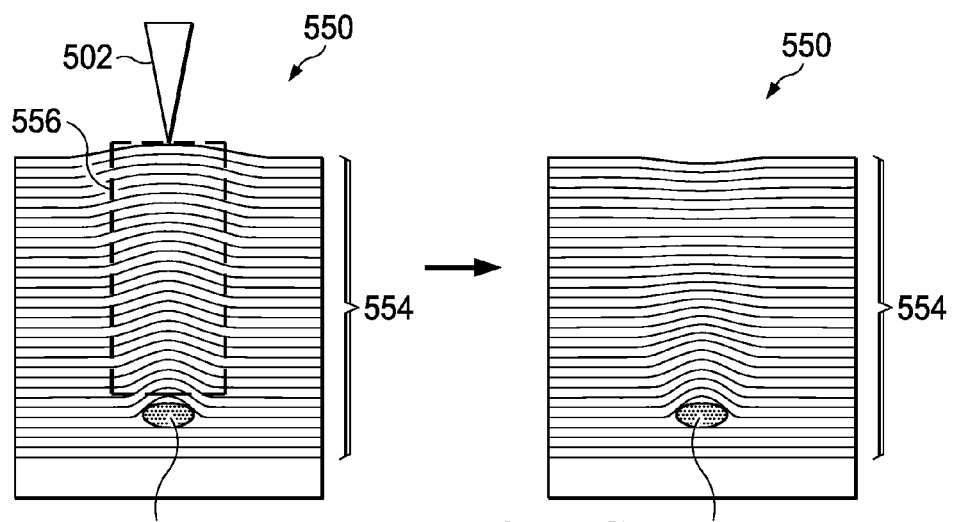
FIGS. 5B-C are examples of repairing an EUV mask using a third method.

Referring to the examples of FIG. 5B-C, a hole 552 is buried in a reflective ML 554 formed in a reflective mask. As shown in FIG. 5B, the hole 552 forms a phase defect 556 overlying the hole 552. The probe tip 502 in the apparatus 550 is applied to the phase defect 556 overlying the hole 552. When the probe tip 502 is heated to a predetermined temperature using an electrical current, the probe tip 502 with the predetermined temperature is considered a thermal source for repairing (e.g., removing, reducing, or dissolving the phase defect—the description of the principle of repairing phase defects is not entirely correct, because removing the bump or pit itself would not completely remove the printability of the defects, the impact of EUV mask phase defects on EUV wafer prints mainly comes from the distorted topography of multi-layer surface, Hence, in addition to the reducing the dimension of phase defects, this method is also used as a thermal source to induce structural deformations of multilayer that cancel out the distortion (of multilayer) caused by buried phase defects 556. As shown in FIG. 5C, the phase defect 556 is repaired by the heated probe tip 502 as a thermal source.

Referring again to FIG. 5A, the cantilever 504 includes a first end and a second end. The cantilever 504 is configured to mount the probe tip 502 at the first end and engage the cantilever mount 506 at the second end. The cantilever 504 is also configured to support the mirror 508. In the present embodiments, the cantilever 504 includes a metal or a metal alloy. The cantilever 504 is designed to support vertical movement of the probe tip 502. For example, the cantilever 504 moves in a downward direction (with reference to the figure) when the probe tip 502 detects a low local surface and in an upward direction when the probe tip 502 detects a high local surface.

The cantilever mount 506 is configured to mount the second end of the cantilever 504. The cantilever mount 506 may include a heavy weight material. The cantilever mount 506 is design to provide a vibration isolation environment for the cantilever 504 and the probe tip 502. For example, the cantilever mount 506 can prevent an environmental vibration impact on the cantilever 504 and the probe tip 502.

The mirror 508 includes a first surface and a second surface. The first surface of the mirror 508 is configured to mount on the cantilever 504. The second surface of the mirror 508 is configured to face the optical unit 510. A high reflective optical film is deposited on the second surface of the mirror 508. The high optical film includes a metal, a metal alloy, or a metal compound. Other high reflective optical materials are possible. The mirror 508 is designed to receive an optical beam from an optical source 512 and reflect the optical beam to an optical detector 514. The mirror 508 is also designed to move with the cantilever 508. The movement of the mirror 508 changes a traveling direction of a reflected optical beam from the mirror 508. Thus, a local surface change can be reflected or sensed by the reflected optical beam and detected by an optical detector.

The optical unit 510 includes the light source 512 and the light detector 514. The optical detector 514 may include a controller to convert an optical signal to an electrical signal. The optical unit 510 is also connected to a computer system 516. The optical unit 510 is configured to overly the mirror 508. As discussed above with reference to the mirror 508, the light source 512 is designed to project an incident optical beam 524a to the mirror. The mirror 508 reflects the incident optical beam 524a and generates a reflective optical beam 524b. The reflective optical beam 524b is detected by the light detector 514. Because the mirror 508 moves with the cantilever 504 and the probe tip 502, a movement of the probe tip 502 in an upward or downward direction caused by a surface topology change is transferred to the mirror 508. The movement of the mirror 508 causes the reflective optical beam 254b to change where (or if) it interacts with the light detector 514. Therefore a surface topology change is detected by the light detector 514 through the probe tip 502, the cantilever 504, the mirror 508 and the reflected optical beam 524b. That is, the local surface height change caused by a phase defect in the reflective ML is detected by the light detector 514, and a location and dimension (e.g. height, width and length) of the phase defect can be determined by the computer 516.

The computer 516 is a standard, general-purpose computer, including a processor, memory, and interface. The computer 516 may be a single computer or a distributed computer, and connects to various components of the optical unit 510, the power supply 518, and the stage 520 as shown in FIG. 5A. The computer 516 includes one or more software programs for controlling or more components of the apparatus 500, calculating a phase defect, and making decisions for repairing a phase defect in a reflective ML deposited on a mask substrate.

The computer 516 controls the stage movement in X, Y and Z direction during the probe tip 502 scanning surface of a mask 522 secured on the stage 520. The computer 516 also receives surface topology information collected by the optical unit 510 and calculates a location and dimension of a phase defect in the mask 522 based on surface topology information received by the optical unit 510. The computer 516 further gives an instruction to the power supply 518 to provide an electrical current to heat the probe tip 502 to a predetermined temperature based on the calculated dimension of the phase defector. The heated probe tip 502 can repair the phase defect by smoothing a related defect area of the reflective ML using the heated probe tip 502 as a thermal source.

The power supply 518 is a standard electrical current supplier, including an input and an output. The power supply 518 connects the computer 516 and the probe tip 502. The power supply 518 receives an instruction from the computer 516 and provides an electrical current to the probe tip 502 for heating the probe tip 502 to a predetermined temperature. The predetermined temperature of the heated probe tip 502 is controlled by controlling electrical current amplitude provided by the power supply 518.

The stage 520 is provided for securing the mask 522 and providing relative movement between it and the probe tip 502. The stage 520 includes motors, roller guides, and tables; secures the mask 522 by vacuum, which can be controlled by the computer system 516, including movement in the X, Y and Z directions during the probe tip 502 scanning.

Figure 6:
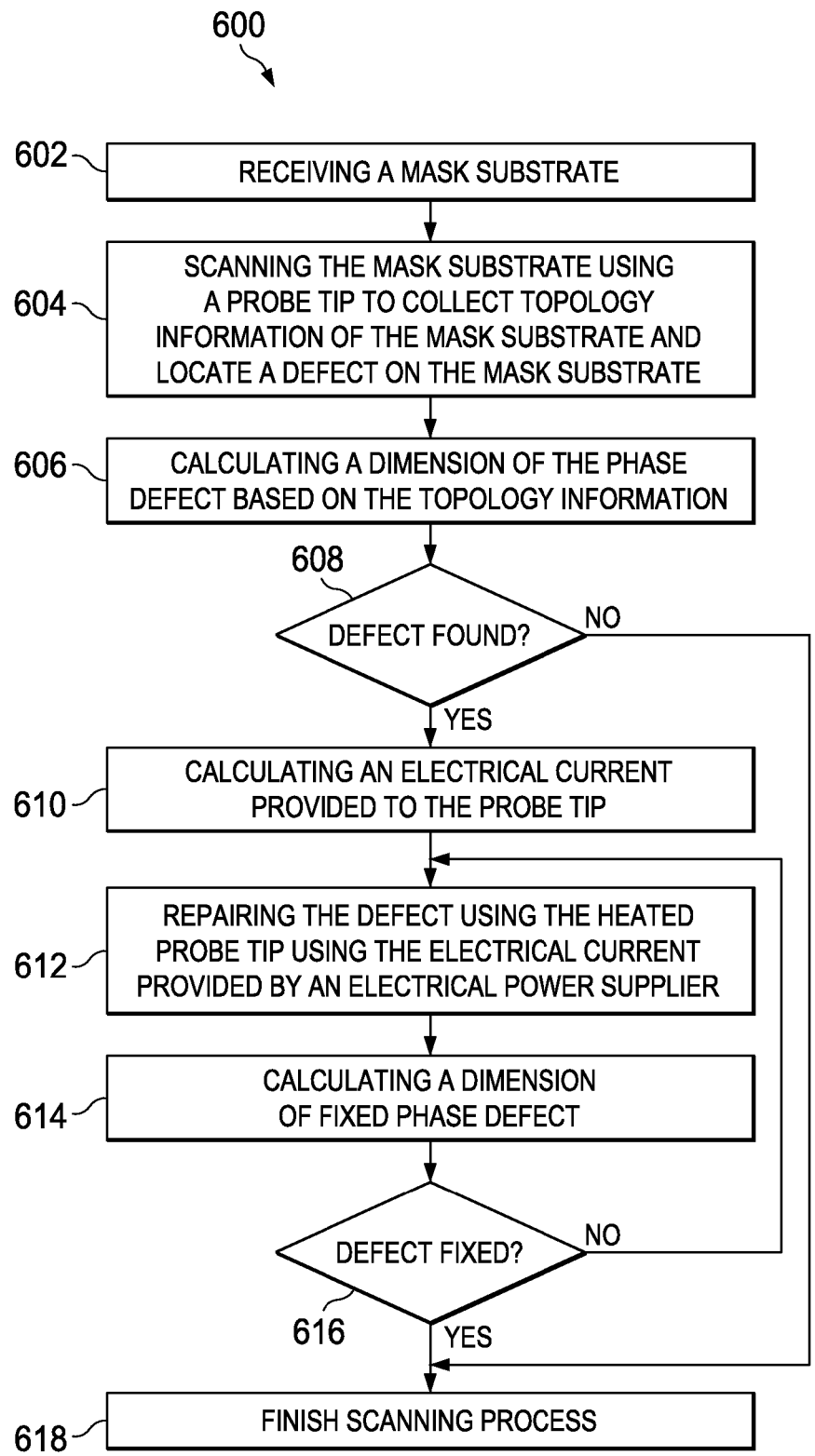
FIG. 6 is a flowchart of a method for repairing an EUV mask according to one or more embodiments of the present invention.

Referring to FIG. 6, a flow chart of a method 600 for repairing a phase defect in a mask substrate by using the apparatus 500 is illustrated for implementing one or more embodiments. The repairing may happens in a mask shop for making a mask, in a fab for fabricating a semiconductor device on a wafer using a mask, or in a glass factory for manufacturing a mask blanket for making a mask. The method 500 begins at step 502 by receiving or providing a mask substrate. The mask substrate may include a ML deposited over a low thermal expansion material (LTEM) substrate. The mask substrate may also include a patterned absorption layer deposited over the ML deposited on a LTEM substrate.

The method 600 proceeds to step 604 by scanning the surface of the mask substrate using a probe tip to collect topology information and locate a defect in/on the mask substrate. In the present embodiment, scanning the surface of a mask substrate includes scanning the surface of a reflective ML deposited on a LTEM substrate. A reflective ML may be a blanket reflective ML deposited on a LTEM substrate or a reflective ML deposited on a LTEM substrate with a patterned absorption layer deposited on the reflective ML. The topology information includes roughness of the surface of the reflective ML.

The method 600 proceeds to step 606 by calculating a dimension of the phase defect based on the topology information collected by scanning the mask substrate using a probe tip. Step 606 includes calculating the location of the phase defect on the mask substrate. Step 606 also includes calculating a dimension, such as height, length, and width of the phase defect. Step 606 further includes calculating a phase defect related (or impacted) area of the reflective ML.

The method 600 proceeds to step 608 by evaluating the dimension of the phase defect in the reflective ML. Step 608 may also include running a simulation to determine an impact of the phase defect on a resist pattern printed in a wafer substrate. If the phase defect is within a specification, for example smaller than 3 nm in height or roughness, the mask substrate is considered as phase defect free and the method 600 proceeds to step 618 to finish scanning the mask substrate. If the phase defect is out of the specification, for example, larger than approximate 2~3 nm in height or roughness, the mask substrate is considered having a phase defect and the phase defect needs to be repaired.

The method 600 proceeds to step 610 by calculating an electrical current to be provided to the probe tip and heating the probe tip to a predetermined or required temperature to repair the detected phase defect. In the present embodiments, a phase defect is repaired by using a heated probe tip as a thermal source to smooth a related area of a reflective ML deposited on a mask substrate. Step 610 includes calculating a temperature range to be heated and time duration at the temperature range based on component of the reflective ML and a calculated dimension of a phase defect on the reflective ML. Step 610 also includes determining a resistance of the probe tip. Step 610 further includes calculating a current to be provided to the probe tip by an electrical power supply to heat the probe tip to the calculated temperature range.

The method 600 proceeds to step 612 by repairing the phase defect using a probe tip heated by an electrical current provided by an electrical power supply. Step 612 includes providing a calculated current to the probe tip to heat the probe tip to a predetermined or required temperature and maintain at the required temperature by the electrical current. In one embodiment, a probe tip is heated from approximate 30 to about 600° C. for about 3 to 5 seconds. Step 612 also includes scanning a calculated phase defect impacted area in a reflective ML using the heated probe tip with the predetermined or required temperature so that the phase defect is repaired by smoothing the phase defect impacted area in the reflective ML using the high temperature probe tip as a thermal source. Step 612 further includes collecting topology information of the repaired phase defect during scanning and repairing processes using the heated probe tip. Therefore, in the present embodiments, the repairing and confirmation can be performed at the same time because the repairing is executed by a heated probe tip scanning a phase defect in a reflective ML.

The method 600 proceeds to step 614 by calculating a dimension of the repaired phase defect based on topology information collected by scanning the mask substrate using the heated probe tip for repairing the phase defect. Step 614 includes calculating the location of the repaired phase defect on the mask substrate. Step 614 also includes calculating height, length, and width of the phase defect. Step 614 further includes calculated a phase defect related (or impacted) area of the reflective ML.

The method 600 proceeds to step 616 by making a decision based on the topology information collected at step 614. Step 616 includes evaluating the dimension of the repaired phase defect in the reflective ML. Step 616 may also include running a simulation to determine impact of the repaired phase defect on a resist pattern printed in a wafer substrate. If the repaired phase defect is within a predetermined specification, the phase defect in the reflective ML is considered to be fixed and the method proceeds to step 618 by finishing repairing process. If the repaired phase defect is out of the specification, the method 600 proceeds back to step 612 by repairing the phase defect again by scanning the phase defect using a heated probe tip with a predetermined or required temperature.

At step 618 includes finishing the canning process on the rest of the mask substrate. This may include repairing one or more additional defects, as discussed above. This may also include revisiting and potentially re-repairing any detected phase defects. Step 618 may also include a cleaning process, as well as packaging the repaired mask blanket and shipping the repaired mask blanket to a mask shop in a glass factory for manufacturing the mask blanket. Step 618 may also include fabricating a mask using the repaired mask blanket in a mask shop. This may include forming a resist pattern on a wafer substrate using the repaired mask on an exposing tool. Additional steps can be provided before, during, and after the method 600, and some the steps described can be replaced, eliminated, or moved around for additional embodiments of the method 600. The method 600 is example embodiments, and is not intended to limit the present invention beyond what is explicitly recited in the claims.

Figure 7:
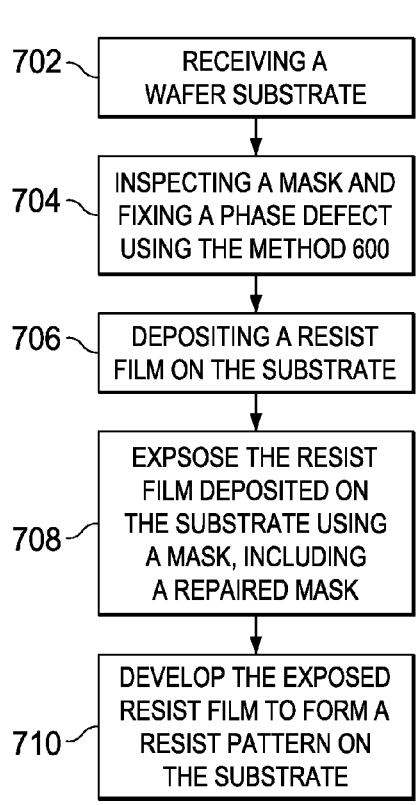
FIG. 7 is a flow chart of a method for forming a semiconductor device on a wafer substrate using the system of FIG. 1, according to one or more embodiments of the present invention.
Figure 8:
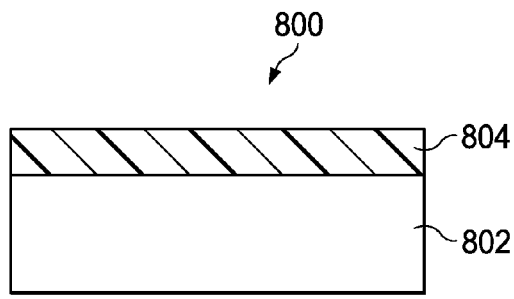
FIGS. 8-10 are cross sectional views of a semiconductor device being formed using the method of FIG. 7.
Figure 9:
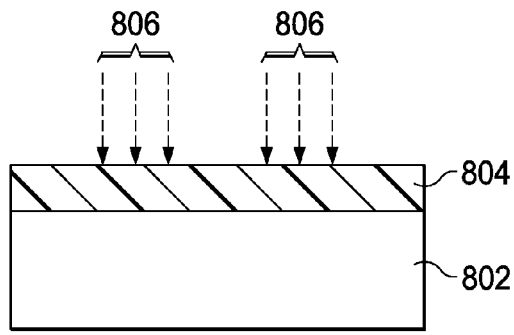
Figure 10:
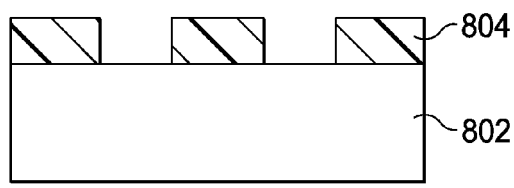

Referring to FIG. 7, a flow chart of a method 700 for forming a semiconductor device on a wafer substrate using the system 100 is illustrated for benefiting from one or more embodiments. FIGS. 8-10 are cross sectional views of forming a semiconductor device 800 using the method 700 according to one or more embodiments. In the present embodiments, a semiconductor device is also referred to as a device. It is understood that additional steps can be provided before, during, and after the method 700, and some the steps described can be replaced, eliminated, or moved around for additional embodiments of the method 700. The method 700 is example embodiments, and is not intended to limit the present invention beyond what is explicitly recited in the claims.

The method 700 begins at step 702 by receiving or providing a wafer substrate. In some embodiments, the wafer substrate may include a silicon wafer. Alternatively or additionally, the wafer substrate includes another elementary semiconductor, such as germanium; a compound semiconductor including silicon carbide, gallium arsenic, gallium phosphide, indium phosphide, indium arsenide, and/or indium antimonide; or an alloy semiconductor including SiGe, GaAsP, AlInAs, AlGaAs, GaInAs, GaInP, and/or GaInAsP. In yet another alternative, the wafer substrate includes a semiconductor on insulator (SOI) structure. In other embodiments, the wafer substrate also includes one or more conductive and/or dielectric films. In the present embodiment, the dielectric film may include silicon oxide, high k dielectric material film, or a combination of silicon oxide and high k dielectric material, and the conductive thin film for the gate electrode film may include doped polysilicon, or a metal, such as aluminum (Al), copper (Cu), tungsten (W), nickel (Ni), titanium (Ti), gold (Au), platinum (Pt) or alloy of the metals thereof.

The method 500 proceeds to step 704 by inspecting a mask using the method 600 as shown in FIG. 6. In the present embodiments, inspecting the mask includes scanning the mask using a probe tip to locate a defect, calculating a dimension of the defect, repairing the defect using the heated probe tip, and verifying if the effect is fixed.

The method 500 proceeds to step 706 by depositing a resist film on a wafer substrate. In the present embodiment, a resist is also referred to as a photo resist. A resist may include a positive resist or a negative resist. A resist film may include a single layer resist film or a multiple layer resist film. One way of depositing a resist film on the substrate includes using a coating process, for example a spin-on process. Another way includes performing a dehydration process before applying the resist on the substrate, which can enhance an adhesion of the resist film to the wafer substrate. The dehydration process may include baking the substrate at a high temperature for a duration of time, or applying a chemical such as hexamethyldisilizane (HMDS) to the substrate. A different way may also include a soft bake (SB) process to drive a solvent out of a resist film and increase mechanical strength of a resist film. Another alternative way may include applying an antireflective coating, such as a bottom antireflective coating (BARC) or a top antireflective coating (TARC). With reference to the example of FIG. 8, a resist film 804 is deposited on a wafer substrate 802.

The method 700 proceeds to step 708 by exposing a resist film deposited on a wafer substrate. In one embodiment, exposing the resist film includes using a mask. In another embodiment, exposing the resist film includes using a mask with a defect fixed by using the apparatus 500 and the method 600. With reference to the example of FIG. 9, the resist film 804 deposited on the wafer substrate 802 is exposed by patterned light 806.

The method 700 proceeds to step 710 by applying a developer on an exposed resist film deposited on a substrate to form a resist pattern on the substrate. In one embodiment, a developer includes a water based developer, such as tetramethylammonium hydroxide (TMAH), for a positive tone development (PTD). In another embodiment, a developer may include an organic solvent or a mixture of organic solvents, such as methyl a-amyl ketone (MAK) or a mixture involving the MAK, for a negative tome development (NTD). Applying a developer includes spraying a developer on the exposed resist film, for example by a spin-on process. Applying a developer also include using a post exposure bake (PEB), a post develop bake (PDB) process, or a combination thereof. With reference to the example of FIG. 10, the patterned resist film 604 is formed on the substrate 602.

Thus, the present disclosure describes an apparatus for repairing a defect in a mask. The apparatus includes a probe tip configured to contact the mask, wherein the probe tip scans the mask for locating a defect in the mask and repairing the defect by heating the probe tip to a predetermined temperature using an electrical current, a cantilever configured to mount the probe tip wherein the cantilever includes a mirror, an optical unit having a light source projecting a light beam on the mirror and a light detector receiving a reflected light beam from the mirror, wherein the reflected light beam carries topology information of the defect, and an electrical power supply configured to connect the probe tip, wherein the electrical power supply provides the electrical current to the probe tip and heats the probe tip to the predetermined temperature.

The apparatus further includes a computer system configured to connect the optical unit, the electrical power supply, and the stage. The computer system is designed to calculate location and a dimension of the defect. The probe tip includes a metal, a metal alloy, a metal compound, or a diamond. The probe tip includes a resistance to the electrical current. The probe tip is configured to be heated to the predetermined temperature by the electrical current as a thermal source overlying the defect. The predetermined temperature is a function of the electrical current. The predetermined temperature ranges from approximate 400 to 800° C.

In one or more embodiments, a method of repairing a defect in a mask is described. The method includes receiving a mask substrate having a multilayer (ML) layer, wherein the ML includes a defect buried in the ML, scanning the mask substrate using a probe tip, wherein the probe tip contacts the ML, calculating a location and a dimension of the defect using a scanning result, and scanning the defect using the probe tip having a predetermined temperature, wherein scanning the defect includes heating the probe tip to the predetermined temperature using an electrical current so that the defect is repaired by the heated probe tip. The method includes fabricating a patterned mask using the mask substrate after the defect is repaired. Heating the probe tip includes providing the electrical current to the probe tip by an electrical power supply. Heating the probe tip to the predetermined temperature includes heating the probe tip to a temperature ranging from approximate 400 to 800° C. using the electrical current. Scanning the defect using the probe tip having the predetermined temperature includes repairing the defect using the probe tip having the predetermined temperature as a thermal source overlying the defect. Repairing the defect includes smoothing the defect using the probe tip having the predetermined temperature as the thermal source. Smoothing the defect includes reducing a dimension of the defect using the probe tip having the predetermined temperature as the thermal source.

In some embodiments, a method of fabricating a device using a mask having a defect buried into a multilayer (ML) is described. The method includes the method receiving a wafer substrate, repairing the mask, depositing a resist film on the wafer substrate, exposing the resist film using the repaired mask, and developing the exposed resist film to form a resist pattern on the wafer substrate. Repairing a mask includes positioning a probe tip above the ML, scanning the mask substrate using the probe tip, monitoring a physical response of the probe tip during scanning, calculating a location and dimension of the defect based, at least in part, on the monitored physical response, and applying energy to the probe tip at the location, so that the defect is modified by the energy. Applying energy to the probe tip includes heating the probe tip to a predetermined temperature using an electrical current. Heating the predetermined temperature ranges from approximate 200 to 1200° C. The predetermined temperature is a function of the electrical current. The method further includes continuing to scan the mask substrate using the probe tip after applying energy to the probe tip at the location.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for repairing a mask, the apparatus comprising:
    a probe tip configured to contact the mask, wherein the probe tip scans the mask for locating a defect in the mask;
    a cantilever configured to mount the probe tip, wherein the cantilever includes a mirror;
    an optical unit having a light source projecting a light beam onto the mirror and a light detector receiving a reflected light beam from the mirror, wherein the reflected light beam carries topology information of the defect;
    an electrical power supply connected to the probe tip; and
    a computer system configured for identifying the defect from the optical unit, and instructing the electrical power supply to provide energy to the probe tip.

2. The apparatus of claim 1, wherein the computer system is also configured to scan the probe tip relative to the mask.

3. The apparatus of claim 2, wherein the computer system is designed to calculate location and a dimension of the defect.

4. The apparatus of claim 1, wherein the probe tip includes a metal, a metal alloy, a metal compound, or a diamond.

5. The apparatus of claim 1, wherein the energy is an electrical current, and wherein the probe tip includes a resistance to the electrical current.

6. The apparatus of claim 5, wherein the probe tip is configured to be heated to the predetermined temperature by the electrical current as a thermal source overlying the defect.

7. The apparatus of claim 6, wherein the predetermined temperature is a function of the electrical current.

8. The apparatus of claim 6, wherein the predetermined temperature ranges from approximate 200 to 1200° C.

9. A method of repairing a mask, the method comprising:
receiving a mask substrate having a multilayer (ML), wherein the ML includes a defect buried in the ML;
scanning the mask substrate using a probe tip, wherein the probe tip contacts the ML;
calculating a location and a dimension of the defect using a scanning result; and
scanning the defect using the probe tip having a predetermined temperature, wherein scanning the defect includes heating the probe tip to the predetermined temperature using an electrical current so that the defect is repaired by the heated probe tip.

10. The method of claim 9, further comprising fabricating a patterned mask using the mask substrate after the defect is repaired.

11. The method of claim 9, wherein heating the probe tip includes providing the electrical current to the probe tip by an electrical power supply.

12. The method of claim 9, wherein heating the probe tip to the predetermined temperature includes heating the probe tip to a temperature ranging from approximate 200 to 1200° C. using the electrical current.

13. The method of claim 9, wherein scanning the defect using the probe tip having the predetermined temperature includes repairing the defect using the probe tip having the predetermined temperature as a thermal source overlying the defect.

14. The method of claim 13, wherein repairing the defect includes smoothing the defect or to induce structural deformations of multilayer that cancel out the distortion (of multilayer) caused by buried the defect using the probe tip having the predetermined temperature as the thermal source.

15. The method of claim 14, wherein smoothing the defect includes reducing a dimension of the defect or inducing structural deformations of multilayer that cancels out the distortion (of multilayer) caused by buried defect using the probe tip having the predetermined temperature as the thermal source.

16. A method of fabricating a device using a mask having a defect buried into a multilayer (ML), the method comprising:
receiving a wafer substrate;
repairing the mask, wherein repairing a mask includes:
positioning a probe tip above the ML;
scanning the mask substrate using the probe tip;
monitoring a physical response of the probe tip during scanning;
calculating a location and dimension of the defect based, at least in part, on the monitored physical response; and
applying energy to the probe tip at the location so that the defect is modified by the energy;
depositing a resist film on the wafer substrate;
exposing the resist film using the repaired mask; and
developing the exposed resist film to form a resist pattern on the wafer substrate.

17. The method of claim 16, wherein applying energy to the probe tip includes heating the probe tip to a predetermined temperature using an electrical current.

18. The method of claim 17, where heating the predetermined temperature ranges from approximate 200 to 1200° C.

19. The method of claim 18, wherein the predetermined temperature is a function of the electrical current.

20. The method of claim 16, further comprising:
after applying energy to the probe tip at the location, continuing to scan the mask substrate using the probe tip.

* * * * *